United States Patent

[11] 3,603,890

[72] Inventors Hans Rudolph Camenzind
Los Altos;
Alan Bebin Grebene, Sunnyvale; David
Kleitman, Los Altos Hills, all of, Calif.

[21] Appl. No. 800,998
[22] Filed Feb. 20, 1969
[45] Patented Sept. 7, 1971
[73] Assignee Signetics Corporation
Sunnyvale, Calif.

[54] AMPLITUDE DEMODULATOR USING A PHASE LOCKED LOOP
6 Claims, 2 Drawing Figs.

[52] U.S. Cl. .......... 329/101, 329/122
[51] Int. Cl. .......... H03d 1/18, H03d 3/00
[50] Field of Search .......... 325/329, 330, 331, 428; 329/101, 122, 123, 124; 331/18

[56] References Cited

UNITED STATES PATENTS

| | | | |
|---|---|---|---|
| 2,797,314 | 6/1957 | Eglin .......... | 325/331 |
| 3,100,871 | 8/1963 | Richardson et al. .......... | 325/330 |
| 3,358,234 | 12/1967 | Stover .......... | 325/330 |

*Primary Examiner*—Roy Lake
*Assistant Examiner*—Lawrence J. Dahl
*Attorney*—Flehr, Hohback, Test, Albritton and Herbert ABSTRACT: An amplitude demodulator suitable for integration including a phase locked loop which provides a frequency equal to the carrier frequency of the amplitude modulated signal, in phase components of such two signals being multiplied together to provide, after filtering, the original modulating signal.

INVENTORS
ALAN B. GREBENE
HANS R. CAMENZIND
BY DAVID KLEITMAN
Flehr, Hohbach, Test, Albritton & Herbert
ATTORNEYS INVENTORS
ALAN B. GREBENE
HANS R. CAMENZIND
BY DAVID KLEITMAN
Flehr, Hohbach, Test, Albritton & Herbert
ATTORNEYS

AMPLITUDE DEMODULATOR USING A PHASE LOCKED LOOP

BACKGROUND OF THE INVENTION

The present invention is directed to an amplitude demodulator for an amplitude modulated signal and more specifically to a demodulator using a phase locked loop.

In providing an amplitude demodulator especially for use in integrated circuits it is necessary that the circuit be inductorless. This is because with present technology it is not yet feasible to integrate an inductor component of any substantial size.

In addition, an amplitude demodulator for monolithic integrated use should be simple in construction and reliable in operation. Also the means for providing for selectivity of the demodulated signal should be feasible without an extensive use of tuning capacitors, etc.

OBJECTS AND SUMMARY OF THE INVENTION

It is, therefore, a general object of the invention to provide an improved amplitude demodulator which is especially adapted for integrated circuit form.

It is another object of the invention to provide a demodulator as above which needs no inductors.

It is another object of the invention to provide an amplitude demodulator which is simple and reliable.

In accordance with the above objects there is provided an amplitude demodulator for an amplitude modulated signal having a predetermined range of modulating frequencies and using a phase locked loop. The demodulator comprises phase locked loop means including phase comparator means, a voltage controlled oscillator and filtering means. The phase comparator compares the phase of the output signal of the voltage controlled oscillator with the amplitude modulated signal to provide a difference signal indicative of any phase difference between them. The filtering means filters this difference signal and couples the filtered difference signal to the voltage controlled oscillator whose output signal is controlled thereby. Means are provided for multiplying in phase components of the output signal of the voltage controlled oscillator and the amplitude modulated signal. An output signal is thereby produced by the multiplying means which is similar to the modulation signal of the original amplitude modulated signal. Finally, filtering means are coupled to the multiplying means for filtering out substantially all frequencies outside of the range of the modulation frequencies.

DETAILED DESCRIPTION OF PREFERRED EMBODIMENT

Figure 1:
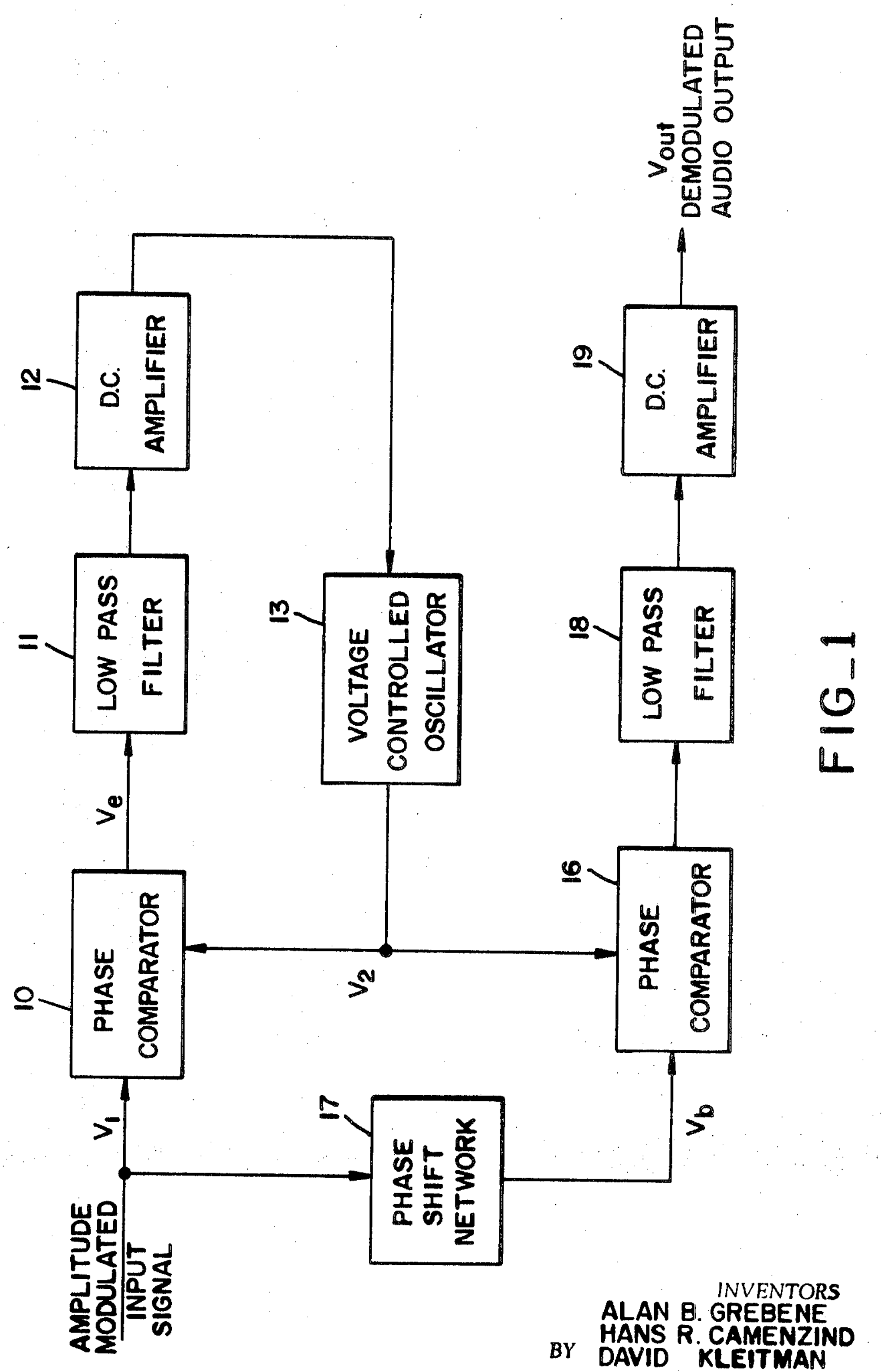
FIG. 1 is a block diagram of an amplitude demodulator embodying the present invention.

Referring now to FIG. 1, an amplitude modulated signal $V_1$ is applied to a phase comparator 10. Phase comparator 10 is a portion of a phase locked loop which also includes a low pass filter 11, DC amplifier 12 and voltage controlled oscillator 13. In general, phase comparator 10 compares the phase of the carrier frequency of the amplitude modulated input signal $V_1$ against the phase of the output $V_2$ of the voltage controlled oscillator 13. The output voltage $V_e$ of comparator 10 is a measure of the phase difference between the two signals, $V_1$ and $V_2$. Error voltage $V_e$ is coupled to low pass filter 11 which eliminates any high frequency components. The output of low pass filter 11 is amplified by DC amplifier 12 which is then coupled into the input of voltage controlled oscillator 13 to modify its output frequency $V_2$.

In operation when the two input signals $V_1$ and $V_2$ to phase comparator 10 have the same frequency, then the error voltage $V_e$ is proportional to the phase difference between these input signals. In this mode the system is referred to as being "Locked." Thus it is apparent that the output of voltage $V_2$ of voltage controlled oscillator 13 is identical in frequency to the carrier frequency of amplitude modulated input signal $V_1$ when the phase locked loop is in a locked condition.

Frequency selection by the phase locked loop is obtained due to the presence of low pass filter within the loop. Any input frequency that significantly differs from the free running frequency of voltage controlled oscillator 13 produces a high frequency error voltage $V_e$. This error voltage is filtered out or rejected by low pass filter 11. Thus, the system responds only to those frequencies which are very near to the free running frequency of the voltage controlled oscillator 13. By adjustment of the free running frequency, the phase locked loop may be tuned over a desired range of input carrier frequencies.

Phase locked loops per se are known in the art as, for example, described in a book entitled *Phaselock Techniques* by Floyd M. Gardner, published by John Wiley and Sons in 1966. In addition, the use of a phase locked loop as a FM demodulator in integrated format is disclosed and claimed in a copending application entitled "Integrated Frequency Selective Circuit and Demodulator" in the names of Hans R. Camenzind and Alan B. Grebene, Ser. No. 748,349, filed July 29, 1968 and assigned to the present assignee. In yet another copending application entitled "Phase Locked Loop with Voltage Controlled Oscillator" in the name of Graham A. Rigby, Ser. No. 758,048, filed Sept. 6, 1968 and assigned to the present assignee, there is disclosed and claimed a phase locked loop in integrated form with a circuit especially suitable for integration. As discussed in the Camenzind copending application the phase locked loop especially lends itself to integration since it requires no inductive components and works effectively with integrated components which would normally have tolerances of ±20 percent. In a normal frequency selective circuit of this type such a tolerance variation would be intolerable.

In accordance with the present invention in order to provide amplitude demodulation of the amplitude demodulated input signal $V_1$ there is coupled to the output, $V_2$of the voltage controlled oscillator 13 a phase comparator or multiplying circuit 16. Such phase comparator compares the phase of its input voltage $V_2$ to the phase of the carrier signal of amplitude modulated signal $V_1$. More specifically, the input signal $V_1$ is coupled into phase comparator 16 through a phase shift network 17 which shifts $V_1$ 90° in phase to provide an input signal $V_b$ to phase comparator 16. Such a 90° phase shift is required since phase comparator 10 introduces into the phase locked loop circuit a 90° phase shift between its input voltage $V_2$ from the voltage controlled oscillator 13 and its input signal $V_1$ which is the amplitude modulated input signal. This 90° phase shift is normal in most standard comparators and occurs due to the fact that the voltage input $V_1$ perform a chopping action on $V_2$ occurs at a 90° phase shift to produce a substantially zero or DC error voltage $V_e$. Thus the phase network 17 is needed to provide in phase components of $V_2$ and $V_1$ to phase comparator 16. It should be noted, however, that the phase shift network 17 could also be provided in the line coupling $V_2$ to phase comparator 16.

OPERATION

A conventional amplitude modulated signal with less than 100 percent modulation (or in terms of modulation index a fraction termed "m") can be represented by a carrier frequency *fo* with two sidebands on either side of the carrier spaced from the carrier by an amount in frequency equal to the modulating frequency. Thus, the greater the range of modulating frequencies, the further from the central frequency will be the sidebands. The amplitude of these sidebands is in accordance with well known communications theory proportional to the modulation index, *m*, divided by 2. Thus where *m* is less than 1 which is the normal mode in communication circuits the sidebands are always less than one-half of the main carrier frequency in magnitude.

Since the carrier and the two sidebands are very closely spaced 80 and the carrier is relatively large in magnitude compared to the sidebands, then the phase locked loop 10–13 will lock on the fixed carrier frequency carrier, *fo*. The sidebands will be automatically rejected. The phase locked loop will inherently lock on to the strongest signal in the vicinity of the free running frequency voltage controlled oscillator 13. Thus, in operation the voltage controlled oscillator 13. should be adjusted so that its free running frequency is equal to the carrier frequency of the input signal which is to be modulated.

The 90° phase shift normally provided by phase comparator 10 between its input voltage $V_2$ from voltage controlled oscillator 13 and input signal $V_1$ also provides in accordance with well known communications theory the automatic cancellation within phase comparator 10 of any information contained in the sidebands of the input signal $V_1$. Thus, the sidebands do not influence the operation of the phase locked loop and the output voltage $V_2$ of the voltage controlled oscillator 13 is a frequency of fixed amplitude which is identical in frequency to the carrier frequency of the input signal but shifted in phase from it by 90°.

Application of $V_2$ to phase comparator or multiplying circuit 16 along with the phase shifted input signal $V_1$ (now designated $V_b$) produces at the output of phase comparator 16 both sum and difference components. By use of a low pass filter 18 high frequency components produced by comparator 16 are filtered out and thus DC amplifier 19 has as its output voltage, $V_{out}$the demodulated audio which was originally impressed on amplitude modulated input signal $V_1$. Ideally low pass filter 18 should have a pass frequency which is substantially equal to the maximum range of modulating frequencies expected on the input signal $V_1$.

If the phase relation between $V_2$ and $V_b$ (the phase shifted input signal $V_1$) is other than 0°, then the magnitude of the output signal is reduced in proportion to the cosine of the phase angle. Thus, it is apparent that small phase differences can be tolerated.

In summary, the circuit of FIG. 1 provides a center frequency which is determined by the free running of voltage controlled oscillator 13. Adjustment of this frequency selects the particular carrier frequency which is desired to be locked onto and demodulated. The interference rejection propertier of the circuit frequencies in adjacent channels are determined by the low-pass filters 11 and 18. Proper design of these filters will provide a highly selective circuit. Moreover since low-pass filter 18 is not a component of the phase locked loop 10–13 it can e chosen to have a relatively sharp rolloff characteristic to provide a higher interference rejection than is normally available in conventional amplitude modulation detectors without affecting the stability requirements of the phase locked loop which are partially determined by the characteristics of low-pass filter 11. The phase shift network 17 as will be discussed below can be chosen to be of the resistor-capacitor type which is easily integrated.

Figure 2:
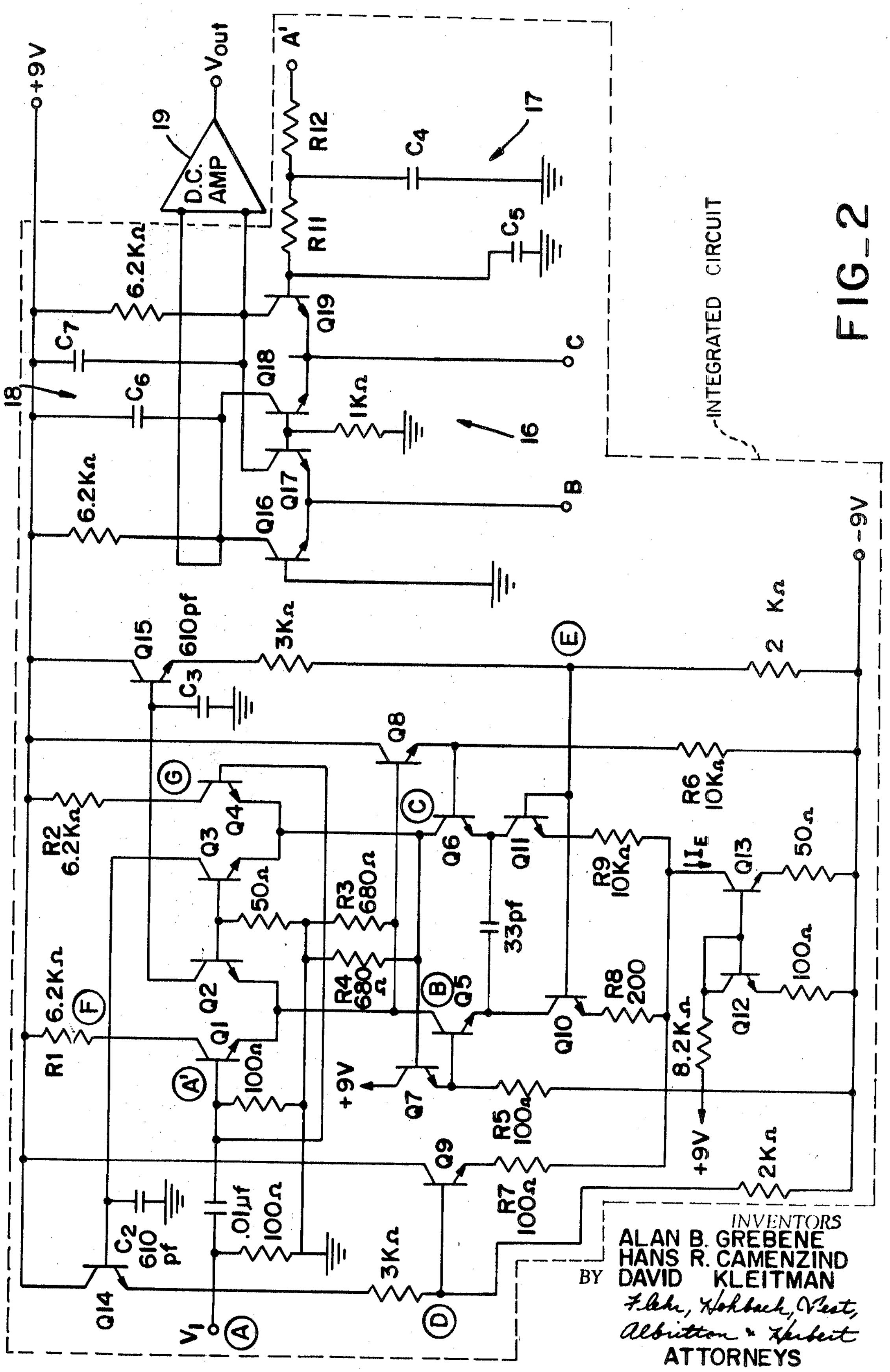
FIG. 2 is a detailed circuit schematic of FIG. 1.

FIG. 2 illustrates a detailed circuit schematic of the circuit of FIG. 1 in which the components for the phase locked loop itself 10 through 13 are identical to those disclosed in the above-mentioned copending Rigby application. More specifically, transistors Q1 through Q4 form a phase comparator and amplifier which are in combined form, transistors Q5 through Q8, voltage controlled oscillator 13, and transistors Q9 through Q11 the control circuit for the voltage controlled oscillator 13. Lowpass filter 11 consists of capacitor components C2, C3 and resistors R1 and R2.

The amplitude modulated input $V_1$ is supplied as indicated at point A in the circuit. The points marked D and E indicate the input to voltage controlled oscillator and the output from the oscillator to the comparator are the points B and C which are at the collectors of transistors Q5 and Q6 respectively. As described in the Rigby copending application, this portion of the circuit lends itself to integration as is described in that application and in fact the topology shown in FIG. 2 is suitable for integration.

The additional components added to the phase locked loop include an additional phase comparator 16 which comprises transistors Q16 through Q19. It is apparent these transistors are identical along with associated resistors is identical in topology to comparator transistors Q1 through Q4. The emitters of these transistor are coupled to points B and C as indicated which is actually the output of voltage controlled oscillator 13. The phase shift network 17 is coupled to the base inputs of Q16 and Q19 of comparator 16 and is composed of resistors R11 and R12 connected in series between the base of Q19 and the point A′ which is the base input of transistor Q1 which in turn is coupled through a capacitor to voltage $V_1$. Phase shift network 17 also includes a capacitor C4 coupled to ground and a capacitor C5 coupling the base of Q19 to ground. Thus a typical $\pi$-type phase shift network is illustrated. Low-pass filter 18 includes the capacitor elements C6 and C7 which are coupled from the +9 volt line to the collectors of transistors Q18 and Q17 respectively. DC amplifier 19 is also coupled to the collectors of transistors Q18 and Q17. The DC amplifier would be of any suitable type which is easily integrated.

The circuit of FIG. 2 represents an integrated circuit. The details of such integration are better shown in the Rigby copending application. The additional portion of the circuit comprising comparator 16 phase shifter 17, low-pass filter 18 and amplifier 19 would be integrated in an analogous manner. Note that there are no inductors to be integrated.

Control of the free running frequency of voltage controlled oscillator is achieved as best illustrated in FIG. 2 by the adjustment of the current $I_E$ which is the collector current of Q13. This may be accomplished for example by variation of the emitter resistance of either Q13 or Q12.

Thus the present invention has provided an improved amplitude demodulator which is easily integrated and needs inductors. Moreover, because of the method of AM detection in providing a frequency equal to the carrier frequency a simple and reliable demodulator is provided.

We claim:

1. An amplitude demodulator for an amplitude modulated signal having a predetermined range of modulating frequencies using a phase locked loop comprising, a semiconductor body, phase locked loop means including phase comparator means receiving the amplitude modulated signal and providing an output signal, filtering means coupled to the phase comparator means, a voltage controlled oscillator coupled between the phase comparator means and the filtering means, said voltage controlled oscillator providing an output signal, said phase comparator means comparing the phase of the output signal of said voltage controlled oscillator with said amplitude modulated signal to provide a difference signal indicative of any phase difference, said filtering means filtering said difference signal and coupling said filtered difference signal to said voltage controlled oscillator whose output signal is controlled thereby, means for multiplying in phase components of said output signal of said voltage controlled oscillator and said amplitude modulated signal whereby an output signal is produced by said multiplying means similar to he modulation signal of said amplitude modulated signal, and filtering means coupled to said multiplying means for filtering out substantially all frequencies outside of said range of said modulating frequencies, said demodulator being formed exclusively of noninductive type circuit elements, substantially all of said circuit elements being formed in said semiconductor body, said demodulator being capable of assimilating tolerance variations in said circuit elements of greater than 10 percent.

2. An amplitude demodulator as in claim 1 together with means for phase shifting at least one of said output signal of said voltage controlled oscillator and said amplitude modulated signal for applying in phase components of such signals to said multiplying means.

3. An amplitude demodulator as in claim 2 in which said output signal of said voltage controlled oscillator is 90° out of phase with said amplitude modulated signal and said phase shifting means provides a 90° phase shift for one of such signals.

4. An amplitude demodulator as in claim 1 in which said filtering means coupled to the multiplying means is of the low pass type.

5. An amplitude demodulator as in claim 1 in which said voltage controlled oscillator has an adjusted free running frequency, said phase locked loop locking onto said amplitude modulated signal at or adjacent to said free running frequency.

6. An amplitude demodulator as in claim 1 wherein said multiplying means includes a phase comparator having first and second inputs, means coupling the output signal of the voltage controlled oscillator to the first input and together with phase shifting means coupling the amplitude modulated signal to the second input.